(12) United States Patent
Youn

(10) Patent No.: US 7,881,065 B1
(45) Date of Patent: Feb. 1, 2011

(54) CIRCUIT WITH IMPROVED ELECTROSTATIC DISCHARGE SUSCEPTIBILITY

(75) Inventor: Tai Won Youn, Albuquerque, NM (US)

(73) Assignee: TC License Ltd., Hummelstown, PA (US)

( * ) Notice: Subject to any disclaimer, the term of this patent is extended or adjusted under 35 U.S.C. 154(b) by 1195 days.

(21) Appl. No.: 11/410,202

(22) Filed: Apr. 25, 2006

(51) Int. Cl.
*H05K 5/00* (2006.01)
(52) U.S. Cl. .................. 361/753; 361/761; 361/760
(58) Field of Classification Search .............. 361/794, 361/752, 800, 797, 790, 776–777, 760–761, 361/748, 736, 753, 799; 174/250–262; 257/213, 257/288, 327, 328, 355, 356, 362, 360, 659
See application file for complete search history.

(56) References Cited

U.S. PATENT DOCUMENTS

| | | | | |
|---|---|---|---|---|
| 4,383,242 A * | 5/1983 | Sassover et al. ............ 307/10.5 |
| 5,498,972 A * | 3/1996 | Haulin ........................ 324/765 |
| 5,557,209 A * | 9/1996 | Crook et al. ................. 324/537 |
| 5,825,628 A * | 10/1998 | Garbelli et al. .............. 361/763 |
| 6,118,379 A * | 9/2000 | Kodukula et al. ......... 340/572.8 |
| 6,121,880 A * | 9/2000 | Scott et al. ................ 340/572.5 |
| 6,215,401 B1 * | 4/2001 | Brady et al. .............. 340/572.7 |
| 6,275,157 B1 * | 8/2001 | Mays et al. ............... 340/572.5 |
| 6,480,396 B2 * | 11/2002 | Ninomiya .................... 361/780 |
| 6,678,169 B2 * | 1/2004 | Ninomiya .................... 361/780 |
| 6,803,655 B2 * | 10/2004 | Fujio et al. .................. 257/724 |
| 7,068,518 B2 * | 6/2006 | Ueno et al. .................. 361/760 |
| 7,466,560 B2 * | 12/2008 | Hayashi et al. ............. 361/784 |
| 7,501,947 B2 * | 3/2009 | Youn ........................ 340/572.1 |
| 7,594,105 B2 * | 9/2009 | Ohsaka .......................... 713/2 |

* cited by examiner

*Primary Examiner*—Hung S Bui
(74) *Attorney, Agent, or Firm*—Caesar, Rivise, Bernstein, Cohen & Pokotilow, Ltd.

(57) ABSTRACT

An RFID tag includes a capacitor between the ASIC ground pin and the circuit ground. The value of the capacitor is selected so that in the case of electrostatic discharge (ESD), the potential drop is primarily across the capacitor rather than the ASIC. Thus, the ASIC is protected against ESD.

6 Claims, 5 Drawing Sheets

CIRCUIT WITH IMPROVED ELECTROSTATIC DISCHARGE SUSCEPTIBILITY

FIELD OF THE INVENTION

The present invention is directed to a circuit such as a transponder and more particularly to such a circuit which incorporates a capacitor connection to ground for improved susceptibility to electrostatic discharge (ESD).

DESCRIPTION OF RELATED ART

ESD (Electrostatic discharge) is a powerful source of current that can fatally damage electronic circuits. A typical ESD event can send several amperes of current driven by thousands of volts into electronic systems. There are many elements contributing to ESD problems including the product mechanical structure, humidity, material electrical conductivity and dielectric constant, electronic component ESD susceptibility, and manufacturing process environment. ESD symptoms are complex and hard to characterize.

RFID tags are particularly sensitive to ESD. For example, the high temperature rail tag (AT5133) has suffered a significant product failure (up to 30%) due to ESD damage.

FIG. 1 shows the set-up diagram to test a conventional RFID tag for ESD susceptibility. The RFID tag 100 is placed between an ESD discharger 102 and an ESD ground 104. The RFID tag 100 itself includes the following components, enclosed in a plastic case 106: a printed circuit board (PCB) 108, an application-specific integrated circuit (ASIC) 110, and a ground circuit 112.

The electrical characteristics of the key components are following:

Plastic housing: 5.0 for the dielectric constant (Er)
ASIC: rated at 200 V for ESD susceptibility
PCB: FR4 with 4.0 dielectric constant (Er)

FIG. 2 shows the potential stack-up from the ESD ground through the RFID circuits in the housing to ESD discharger. The potential drops are:

Vesd: Total ESD voltage
V1: Voltage drop across the housing top cover
V2: Voltage drop in the air between the housing top cover and the PCB top
V3: Voltage drop across the PCB
V4: Voltage drop in the air between the housing bottom cover and the PCB bottom
V5: Voltage drop across the housing bottom cover The electrical field (Ed) within dielectric material is given by $$Ed=Eo/Er$$

where Eo is the free space electrical field, and Er is the dielectric constant. Therefore the potential drop (Vd) across dielectric material with thickness (T) is given by $$Vd=Ed*T=Eo*T/Er.$$

In other words, the potential drop is proportional to the thickness and inversely proportional to the dielectric constant. When the design target ESD susceptibility of 16 KV is applied to the top case using an ESD discharger (Schaffner Model NSG438), the voltage drop can be calculated as shown in Table I below:

TABLE I

| Dielectric Material Descriptions | Potential Designation | T (thickness, inch) | Dielectric Const (Er) | T/Er | Potential Drop (V) |
|---|---|---|---|---|---|
| top plastic case | V1 | 0.190 | 5 | 0.038 | 1472 |
| Top air | V2 | 0.270 | 1 | 0.27 | 10460 |
| PCB | V3 | 0.060 | 4 | 0.015 | 581 |
| Bottom Air | V4 | 0.060 | 1 | 0.06 | 2324 |
| Bottom Case | V5 | 0.150 | 5 | 0.03 | 1162 |
| Total | N/A | 0.730 | N/A | 0.414 | 16000 |

The above table shows that the potential drop across the PCB is 581 Volts. Since the ASIC ground pin is connected to the PCB bottom, the ASIC will encounter the whole 581 Volts and be damaged because of the low 200 Volts rating of the ASIC. The ASIC would not survive the 16 KV ESD.

SUMMARY OF THE INVENTION

It is therefore an object of the invention to provide an RFID transponder or other circuit with improved resistance to ESD.

To achieve the above and other objects, the present invention is directed to a modification of the circuit of FIGS. 1 and 2 by providing a capacitor between the ASIC and the circuit ground. The value of the capacitor is determined from such things as the ASIC impedance at the operating frequency, and the main ESD frequency component at which the ESD impedance reaches a maximum across the ESD CAP 800.

BRIEF DESCRIPTION OF THE DRAWINGS

A preferred embodiment will be set forth in detail with reference to the drawings, in which.

DETAILED DESCRIPTION OF THE PREFERRED EMBODIMENT

A preferred embodiment of the present invention will now be set forth in detail with reference to the drawings.

Figure 1:
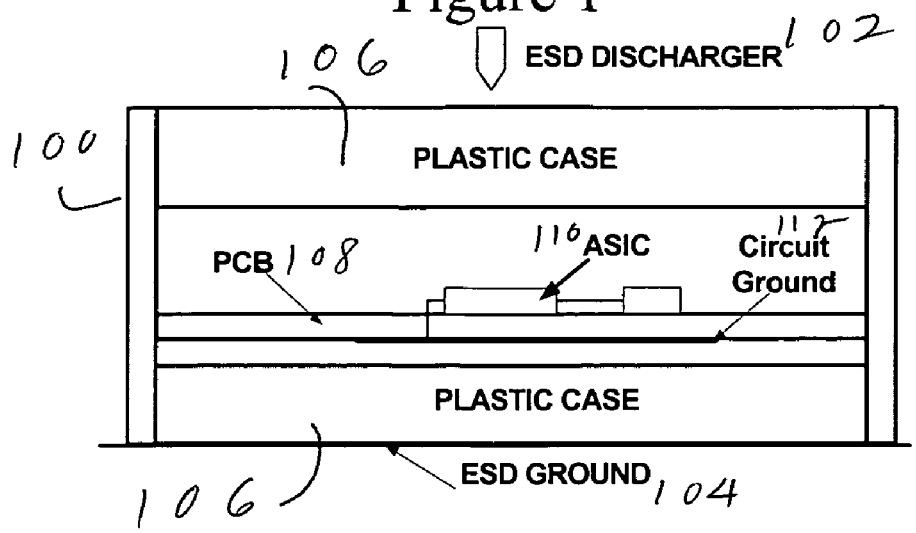
FIG. 1 shows a circuit according to the prior art undergoing ESD testing.
Figure 2:
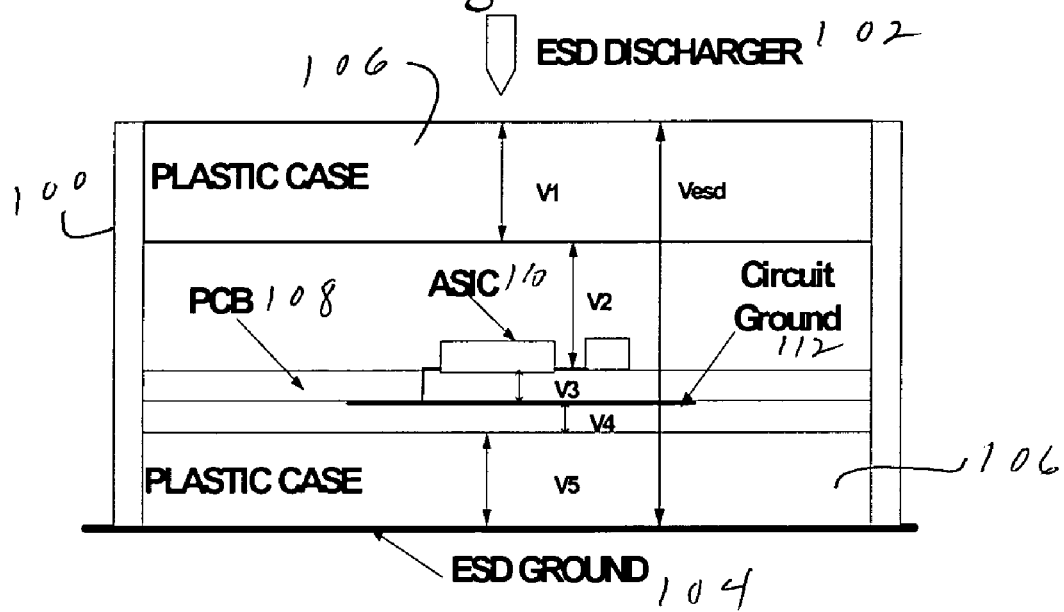
FIG. 2 shows the potential drops across the circuit of FIG. 1.
Figure 3:
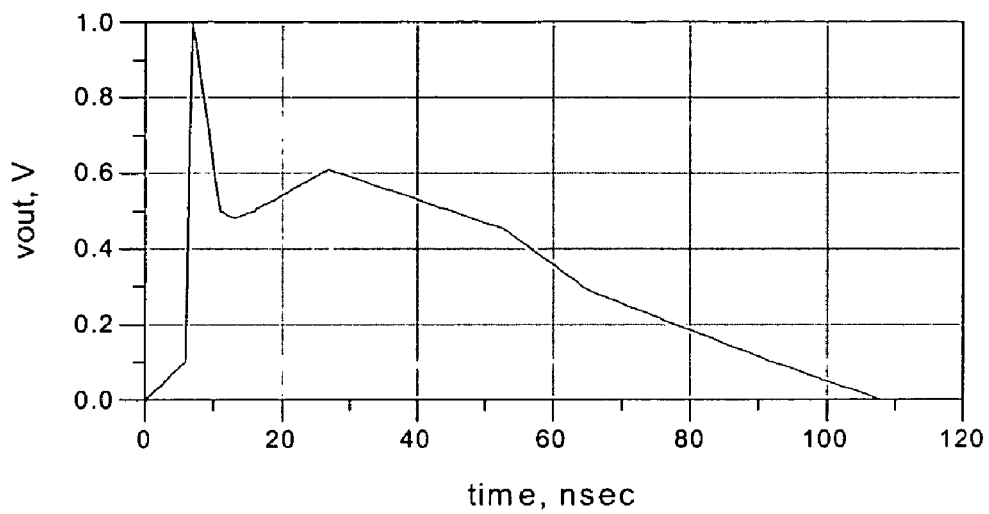
FIG. 3 is a plot of an ESD test signal.
Figure 4:
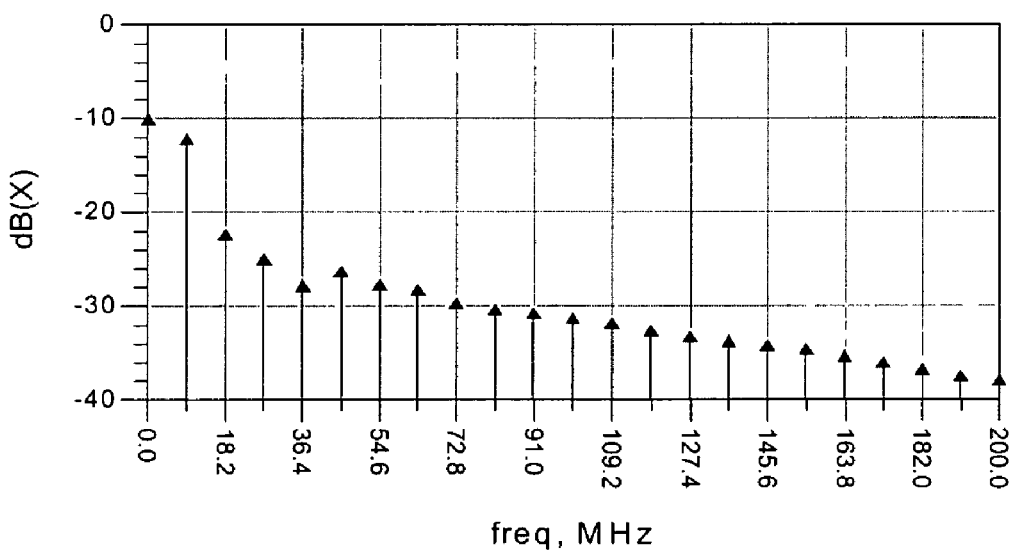
FIG. 4 shows the Fourier spectrum of an ESD test signal for a narrow spectrum.
Figure 5:
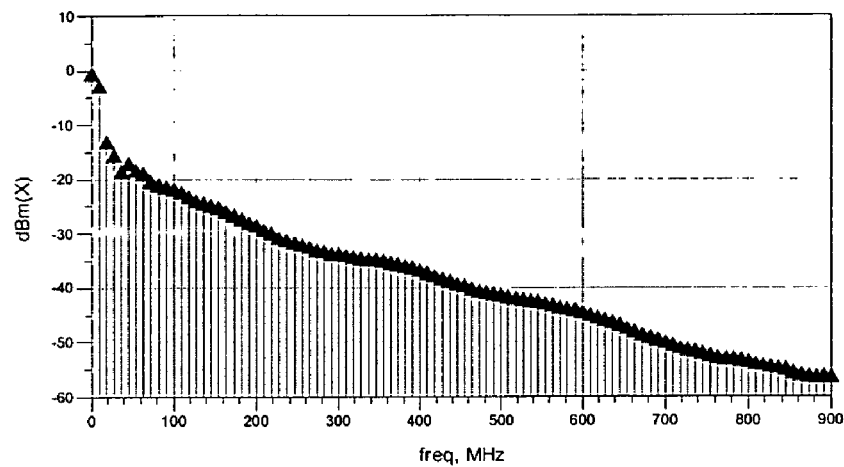
FIG. 5 shows the Fourier spectrum of an ESD test signal for a wide spectrum.

The IEC 61000-4-2 ESD recommends the ESD test signal for the human body model shown in FIG. 3. FIGS. 4 and 5 show the Fourier spectrum of the ESD test signals for narrow (200 MHz) and wide (900 MHz) spectra respectively. FIGS.

6 and 7 show the impedance decrease with the RF power and the bias current increase respectively.

Figure 6:
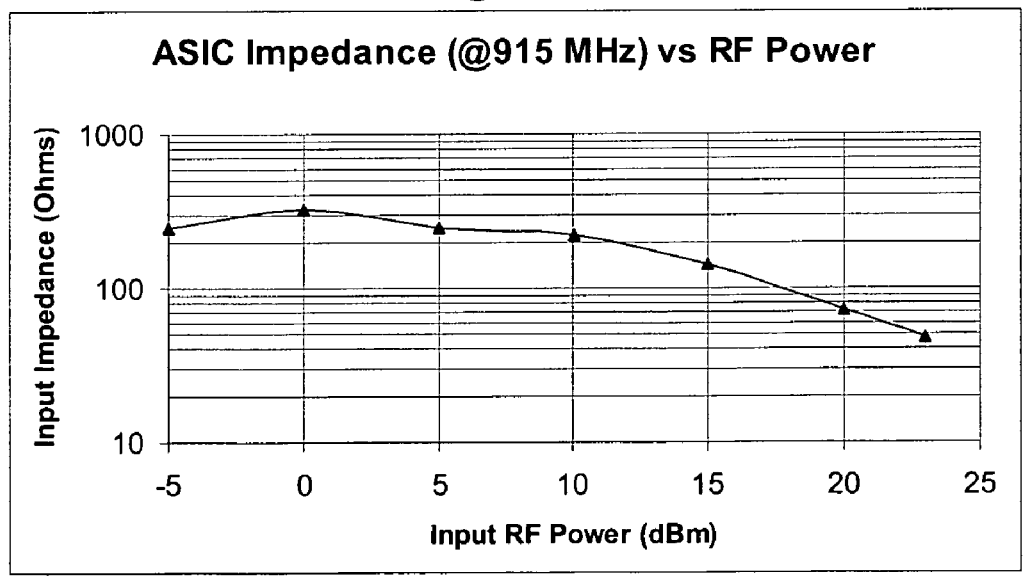
FIG. 6 shows the dependence of the input impedance on RF power.
Figure 7:
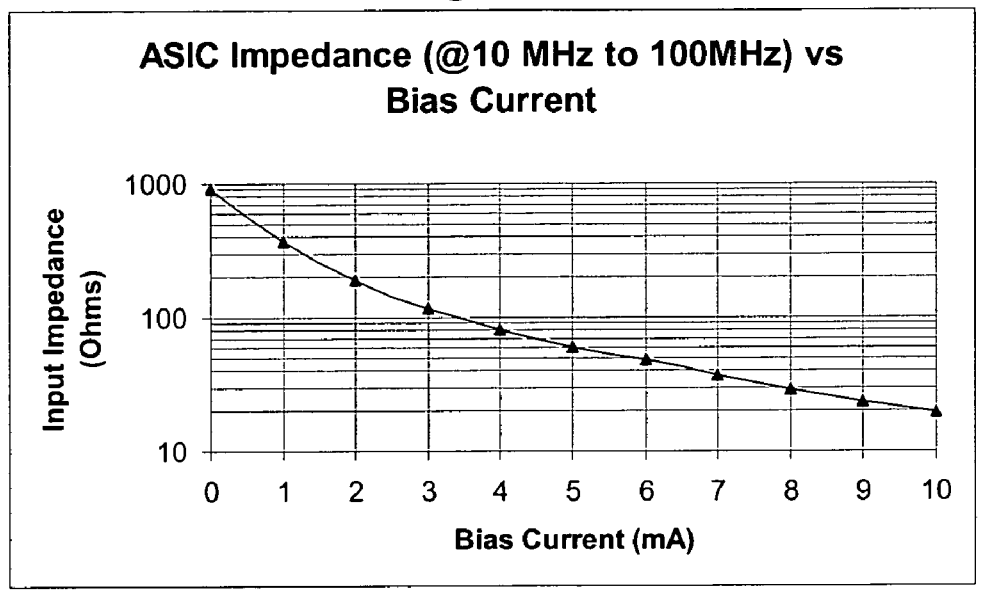
FIG. 7 shows the dependence of the input impedance on bias current.

FIGS. 6 and 7 show that the ASIC impedance decreases to below 20 Ω at the high RF power and high bias current that might represent the ESD conditions. This is the most important ASIC characteristic leading to the new method to improve the ESD susceptibility. Therefore the ESD nature in conjunction with the RFID tag can be summarized by the following characteristics.

First, the ESD test signal has the most energy at around 9 MHz. Beyond that, the energy level drops very significantly (i.e. more than 10 dB).

Second, the ASIC impedance is about 400 Ω (20 Ω-j400 Ω) when the RFID tag is operating at 900 MHz with an RF power level (i.e. −7 dBm) below −5 dBm.

Third, the ASIC impedance is reduced to below 50 Ω with the RF power and the bias current increases representing ESD conditions.

Figure 8:
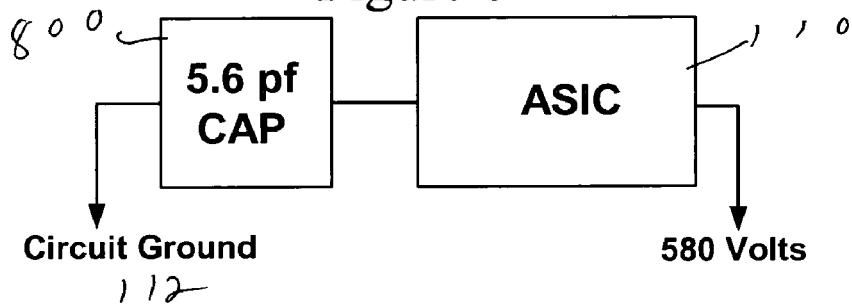
FIG. 8 shows the connection of the capacitor between the ASIC and the circuit ground in the preferred embodiment.

These above three important characteristics invite a new method to improve the ESD susceptibility by inserting a 5.6 pF capacitor (ESD CAP) 800 between the ground pin of the ASIC 110 and the circuit ground 112, as shown in FIG. 8. Since the impedance of a 5.6 pF capacitor is 32 Ω and 2800 Ω at 900 MHz and 10 MHz respectively, the ASIC impedance at normal operating conditions, RFID sensitivity, and the ASIC potential drops are calculated for with and without the ESD CAP, as shown by Table II below.

TABLE II

|  | ASIC Impedance at normal operating condition (Ohms) | RFID Sensitivity (dBm) | ASIC Potential Drop (Volts) |
| --- | --- | --- | --- |
| Without ESD CAP | 20 − j 400 | −8.0 | 581 |
| With ESD CAP | 20 − j 432 | −7.7 | 10 |

The table above shows that ASIC impedance changes very little from 20 Ω-j 400 Ω to 20 Ω-j432 Ω, while the potential drop across the ASIC is reduced from 580 volts to about 10 volts, which is far below the ASIC rating of 200 volts. Meantime, the potential drop across the ESD capacitor (581−10=571 Volts) is about the potential drop (581 Volts) across the PCB.

The RFID sensitivity degrades by 0.3 dB, which can be improved by adjusting from 165 Ω to 196 Ω for a resister that is one of the matching components.

The numbers of the potential stack-up and the ASIC potential drop are expected values based on the calculation to explain the physics explaining ESD. Therefore, the actual measurement numbers could be somewhat different due to the complex nature of ESD and the measurement difficulties of the electrical parameters including material characteristics.

Figure 9:
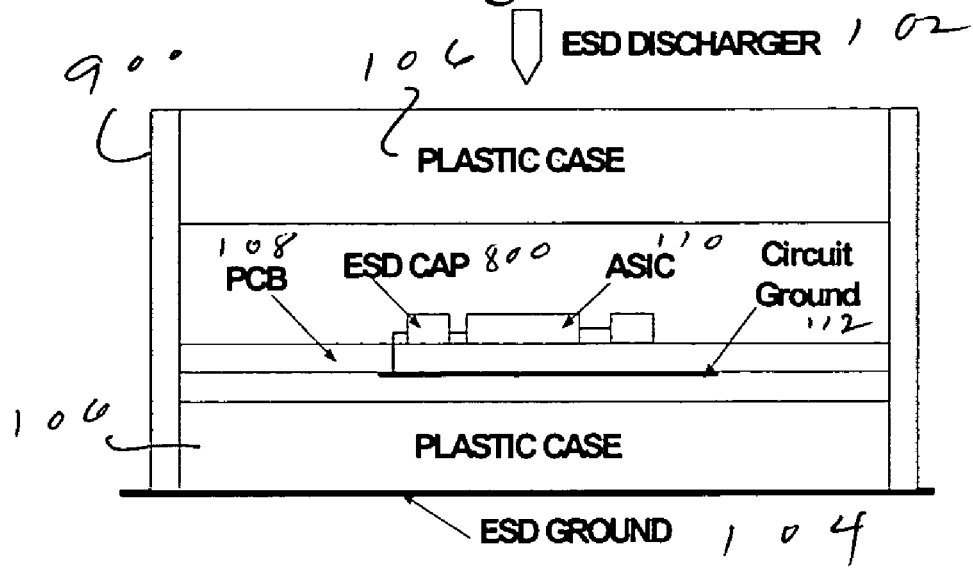
FIG. 9 shows the circuit according to the preferred embodiment undergoing ESD testing.
Figure 10:
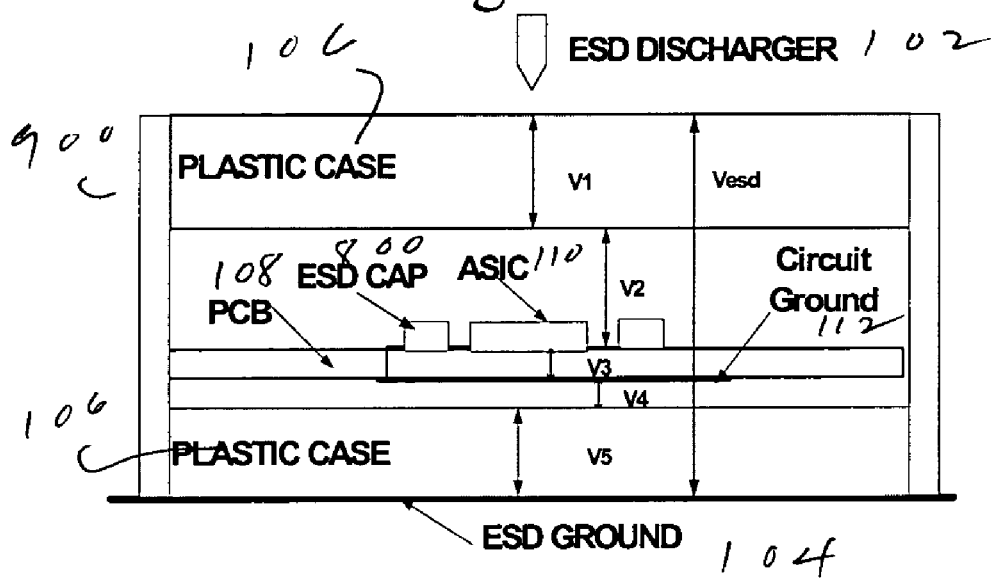
FIG. 10 shows the potential drops across the circuit of FIG. 9.

FIGS. 9 and 10 show the final RFID circuit assembly 900 with the 5.6 pf capacitor 800, and the potential drops across the dielectric material respectively.

The measurement results of the RFID tags (5 units) built with the ESD capacitor show that the new method has improved the ESD susceptibility by factor of three from 5 KV to 16 KV while maintaining the original sensitivity of −8 dBm for the RFID tag.

In an actual working environment, the ESD source and the ground are not visible, and the field strength direction from the source to the ground would be much different from the simple model used for the above analysis. However, the most of the potential drop will be built up across the ESD capacitor rather than across the ASIC for the same reason described so far, no matter what the field strength direction would be.

While a preferred embodiment has been set forth in detail above, those skilled in the art who have reviewed the present disclosure will readily appreciate that other embodiments can be realized within the scope of the present invention. For example, numerical values are illustrative rather than limiting. In particular, the value of the capacitor is determined by the characteristics of the ASIC used and the particular operating characteristics in which the device will be used. Therefore, the present invention should be construed as limited only by the appended claims.

I claim:

1. An electronic device designed for resistance against electrostatic discharge, the electronic device comprising:
   a dielectric case;
   an integrated circuit within the dielectric case and comprising a ground pin;
   a circuit ground within the dielectric case; and
   the integrated circuit having a single electrical connection to the circuit ground through said integrated circuit ground pin, said connection consisting of a capacitor.

2. The electronic device of claim 1, wherein the integrated circuit comprises an application-specific integrated circuit.

3. The electronic device of claim 1, wherein the integrated circuit comprises an RFID transponder circuit.

4. The electronic device of claim 1, wherein the integrated circuit has a voltage threshold, and wherein the capacitor has a capacitance value selected such that a voltage drop across the integrated circuit caused by the electrostatic discharge is reduced to less than the voltage threshold.

5. A method for designing and fabricating an electronic device designed for resistance against electrostatic discharge, the electronic device comprising a dielectric case, an integrated circuit within the dielectric case comprising a ground pin, a circuit ground within the dielectric case, and the integrated circuit having a single electrical connection to the circuit ground through said integrated circuit ground pin, said connection consisting of a capacitor, the method comprising:
   (a) determining characteristics of the electrostatic discharge;
   (b) selecting a capacitance value for the capacitor in accordance with the characteristics of the electrostatic discharge such that a voltage drop across the integrated circuit caused by the electrostatic discharge is reduced to less than the voltage threshold; and
   (c) fabricating the electronic device so that said capacitor is the single electrical connection between the circuit ground and the integrated circuit.

6. The method of claim 5, wherein the characteristics comprise the operating frequency, the ESD main frequency component, and ASIC impedances at the ESD and the operating conditions.

* * * * *